(12) United States Patent
Cheng et al.

(10) Patent No.: US 9,716,161 B2
(45) Date of Patent: Jul. 25, 2017

(54) GATE STRUCTURE HAVING DESIGNED PROFILE AND METHOD FOR FORMING THE SAME

(71) Applicant: Taiwan Semiconductor Manufacturing Co., Ltd., Hsin-Chu (TW)

(72) Inventors: Kai-Li Cheng, Taipei (TW); Che-Cheng Chang, New Taipei (TW)

(73) Assignee: TAIWAN SEMICONDUCTOR MANUFACTURING CO., LTD., Hsin-Chu (TW)

(\*) Notice: Subject to any disclaimer, the term of this patent is extended or adjusted under 35 U.S.C. 154(b) by 8 days.

(21) Appl. No.: 14/503,994

(22) Filed: Oct. 1, 2014

(65) Prior Publication Data

US 2016/0099337 A1    Apr. 7, 2016

(51) Int. Cl.
| | | |
|---|---|---|
| *H01L 29/66* | (2006.01) | |
| *H01L 21/3213* | (2006.01) | |
| *H01L 29/423* | (2006.01) | |
| *H01L 29/78* | (2006.01) | |
| *H01L 21/28* | (2006.01) | |
| *H01L 29/49* | (2006.01) | |
| *H01L 29/51* | (2006.01) | |
| *H01L 29/165* | (2006.01) | |

(52) U.S. Cl.
CPC .. *H01L 29/66545* (2013.01); *H01L 21/28114* (2013.01); *H01L 21/32135* (2013.01); *H01L 29/42376* (2013.01); *H01L 29/66636* (2013.01); *H01L 29/7848* (2013.01); *H01L 21/28079* (2013.01); *H01L 21/28088* (2013.01); *H01L 29/165* (2013.01); *H01L 29/4958* (2013.01); *H01L 29/4966* (2013.01); *H01L 29/517* (2013.01)

(58) Field of Classification Search
CPC ......... H01L 29/66545; H01L 29/66583; H01L 29/66606; H01L 29/66871; H01L 29/6681
See application file for complete search history.

(56) References Cited

U.S. PATENT DOCUMENTS

| | | | |
|---|---|---|---|
| 2005/0133849 A1 | 6/2005 | Jeon et al. | |
| 2011/0079854 A1\* | 4/2011 | Lin | ........... H01L 21/28088 |
| | | | 257/365 |
| 2011/0241118 A1 | 10/2011 | Ng et al. | |
| 2011/0316096 A1 | 12/2011 | Wei et al. | |
| 2013/0119487 A1 | 5/2013 | Lin et al. | |

(Continued)

FOREIGN PATENT DOCUMENTS

| | | | | |
|---|---|---|---|---|
| CN | WO 2014005359 A1 \* | 1/2014 | ........ | H01L 21/28114 |
| TW | 201320331 A1 | 5/2013 | | |

*Primary Examiner* — Davienne Monbleau
*Assistant Examiner* — Leslie Pilar Cruz
(74) *Attorney, Agent, or Firm* — Birch, Stewart, Kolasch & Birch, LLP

(57) ABSTRACT

A semiconductor structure and a method for forming the same are provided. The semiconductor structure includes a metal gate structure having curved sidewalls formed over a substrate. The semiconductor structure further includes spacers formed on the curved sidewalls of the metal gate structure. In addition, each curved sidewall of the metal gate structure has a top portion, a middle portion, and a bottom portion, and an angle between the middle portion and the bottom portion of the curved sidewall of the metal gate structure is smaller than 180° C.

20 Claims, 7 Drawing Sheets

(56) References Cited

U.S. PATENT DOCUMENTS

| | | |
|---|---|---|
| 2013/0146993 A1 | 6/2013 | Chang et al. |
| 2013/0161762 A1 | 6/2013 | Kelly et al. |
| 2013/0320410 A1 | 12/2013 | Lin et al. |
| 2014/0361353 A1* | 12/2014 | Yin .................. H01L 21/28114 257/288 |

* cited by examiner

GATE STRUCTURE HAVING DESIGNED PROFILE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

As technology nodes shrink, in some integrated circuit (IC) designs, there has been a desire to replace the typically polysilicon gate with a metal gate to improve device performance with the decreased feature sizes. One process of forming the metal gate is called a "gate last" process. In a "gate last" process, the metal gate is fabricated last, which allows for a reduced number of subsequent processes.

However, although existing "gate last" processes have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
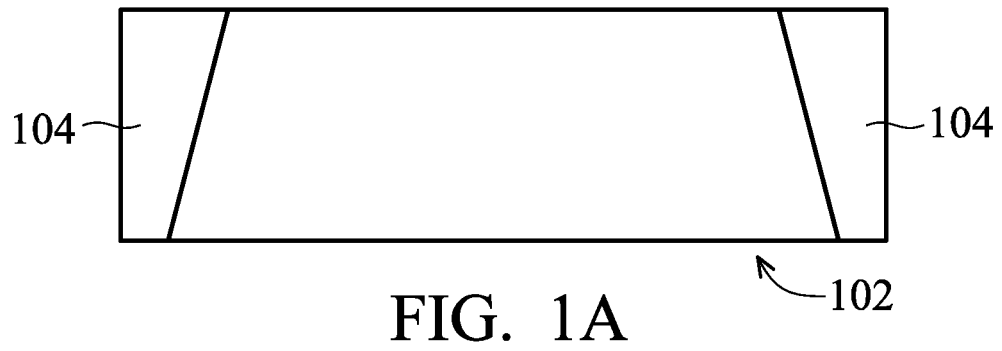
FIGS. 1A to 1M are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor structure are provided in accordance with some embodiments of the disclosure. The semiconductor structure includes a metal gate structure. The metal gate is formed by a gate-last process, in which a dummy gate structure is formed and replaced by the metal gate structure afterwards. The profile of the dummy gate structure is designed to improve the electrical performance of the resulting metal gate structure.

FIGS. 1A to 1M are cross-sectional representations of various stages of forming a semiconductor structure in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, and/or conductive features. Furthermore, substrate 102 may further include single or multiple material layers to be patterned. For example, the material layers may include a silicon layer, a dielectric layer, and/or a doped poly-silicon layer.

In some embodiments, substrate 102 includes a plurality of isolation features 104, such as shallow trench isolation (STI) features or local oxidation of silicon (LOCOS) features. Isolation features 104 are configured to isolate various elements formed in and/or upon substrate 102.

Figure 1B:
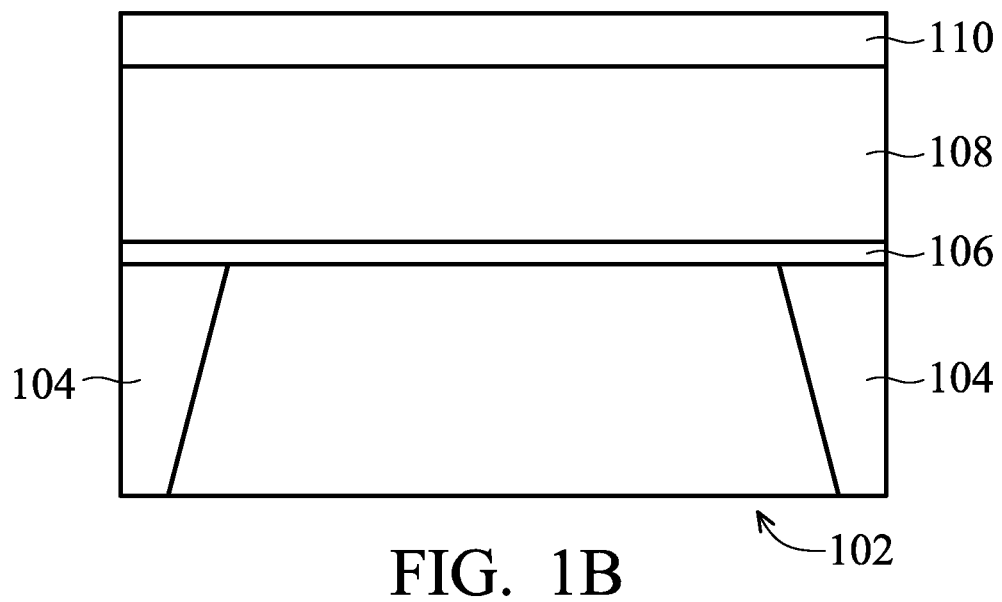

A dummy gate dielectric layer 106, a dummy gate electrode layer 108, and a hard mask layer 110 are formed over substrate 102, as shown in FIG. 1B in accordance with some embodiments.

In some embodiments, dummy gate dielectric layer 106 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. Dummy gate dielectric layer 106 may be formed by chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, dummy gate electrode layer 108 is a polysilicon layer. In some embodiments, hard mask layer 110 is made of silicon oxide, silicon nitride, silicon oxynitride, or silicon carbide. Hard mask layer 110 may be formed by CVD, PVD), ALD, HDPCVD, MOCVD, or PECVD.

Figure 1C:
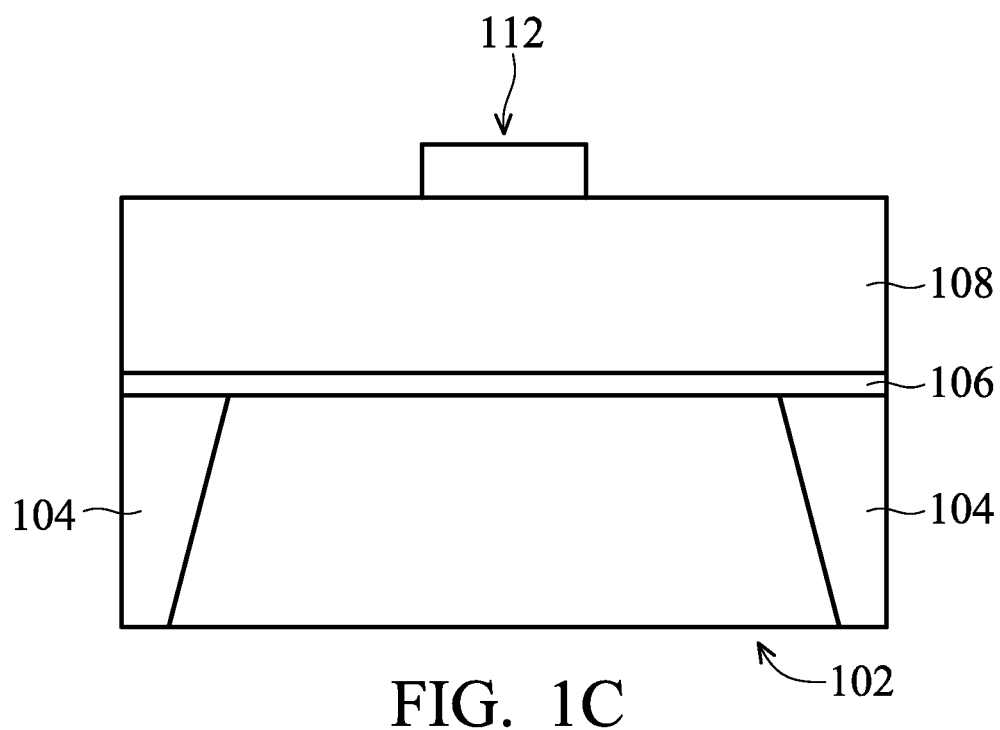

Next, hard mask layer 110 is patterned to form a hard mask structure 112, as shown in FIG. 1C in accordance with some embodiments. Hard mask layer 110 may be patterned by a photolithography patterning processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 1D:
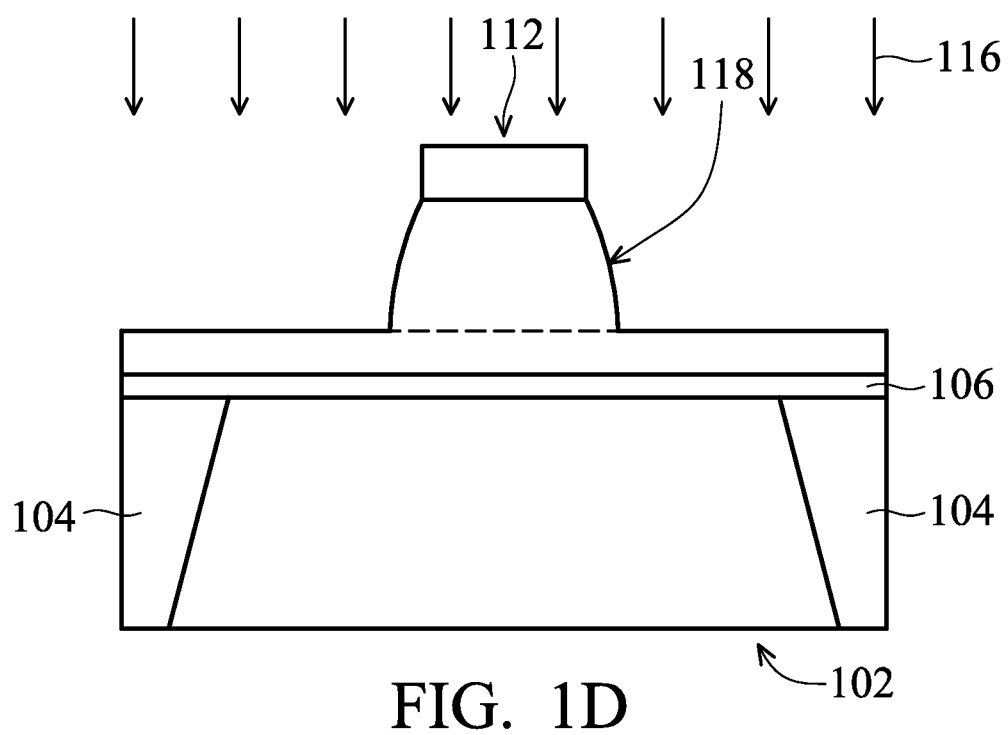
Figure 1E:
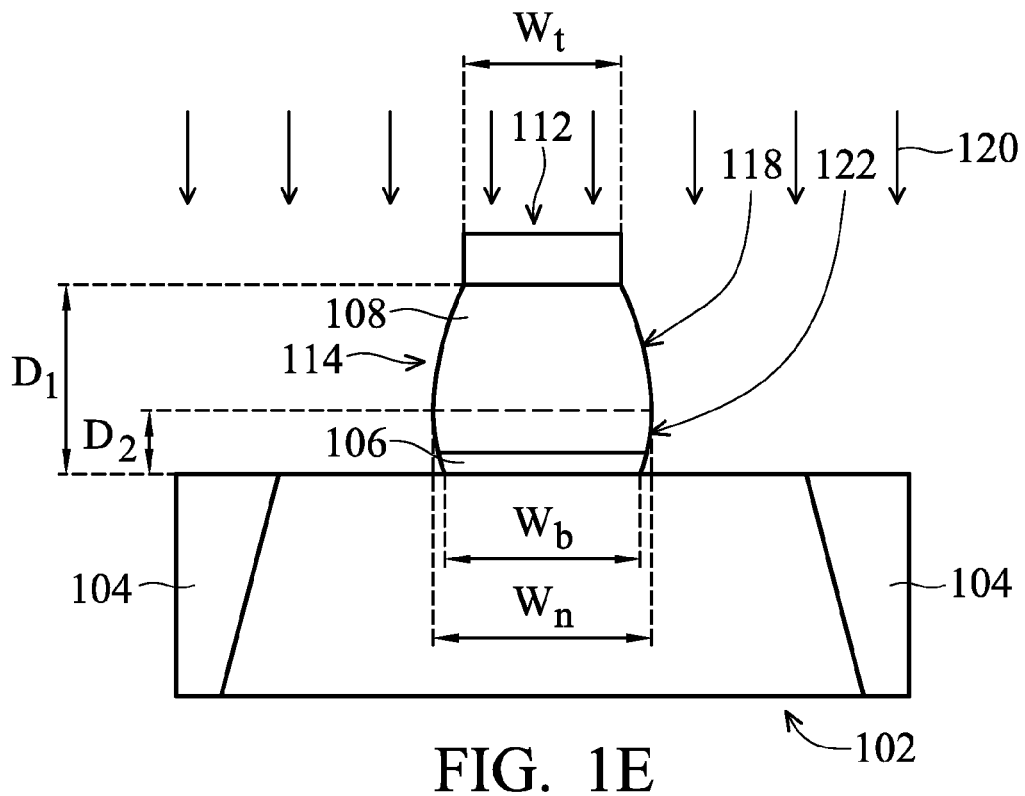

After hard mask structure 112 is formed over dummy gate electrode layer 108, dummy gate electrode layer 108 and dummy gate dielectric layer 106 are etched to form a dummy gate structure 114 below hard mask structure 112. In some embodiments, a first etching process 116 is performed to form an upper portion 118 of dummy gate structure 114, and a second etching process 120 is performed to form a bottom portion 122 of dummy gate structure 114, as shown in FIGS. 1D and 1E. As shown in FIG. 1E, dummy gate structure 114 includes dummy gate electrode layer 108 and dummy gate dielectric layer 106 in accordance with some embodiments.

More specifically, an upper portion of dummy gate electrode layer 108 is etched during first etching process 116, as shown in FIG. 1D in accordance with some embodiments. In some embodiments, first etching process 116 is a dry etching process. In some embodiments, first etching process 116 includes using a first etching gas and a second etching gas. In some embodiments, the first etching gas is $CF_4$, $CH_2F_2$, or $CHF_3$. In some embodiments, the second etching gas is $Cl_2$, HBr, or $SF_6$. In some embodiments, the first etching gas is CF, and the second etching gas is $Cl_2$.

In some embodiments, the flow rate of the first etching gas used in first etching process 116 is in a range from about 5 sccm to about 500 sccm. In some embodiments, the flow rate of the second etching gas used in first etching process 116 is in a range from about 5 sccm to about 150 sccm. In some embodiments, the volume ratio of the first etching gas to the second etching gas used in first etching process 116 is in a range of about 1.3 to about 8.3.

After upper portion 118 of dummy gate structure 114 is formed, a bottom portion of dummy gate electrode layer 108 and dummy gate dielectric layer 106 are etched during second etching process 120, as shown in FIG. 1E in accordance with some embodiments. In some embodiments, second etching process 120 is a dry etching process. In some embodiments, second etching process 120 includes using the same first etching gas and the second etching gas as those used in first etching process 116. In some embodiments, the flow rate of the first etching gas used in second etching process 120 is in a range from about 50 sccm to about 500 sccm. In some embodiments, the flow rate of the second etching gas used in second etching process 120 is in a range from about 10 sccm to about 50 sccm. In some embodiments, the volume ratio of the first etching gas to the second etching gas used in second etching process 120 is in a range of about 1.5 to about 8.5.

In some embodiments, the volume ratio of the first etching gas to the second etching gas used in first etching process 116 is smaller than the volume ratio of the first etching gas to the second etching gas used in second etching process 120. By adjusting the volume ratio of the first etching gas to the second etching gas used in first etching process 116 and second etching process 120, the profile of the resulting dummy gate structure 114 can be controlled.

For example, when the volume ratio of the first etching gas to the second etching gas used is relatively small (such as those used in first etching process 116), the inclination of the sidewall (e.g. the sidewall of upper portion 118) with respect to the top surface of substrate 102 will be relatively small. On the other hand, when the volume ratio of the first etching gas to the second etching gas used is relatively large (such as those used in second etching process 120), the inclination of the sidewall (e.g. the sidewall of bottom portion 122) with respect to the top surface of substrate 102 will be relatively large.

In addition, dummy gate structure 114 has a top width $W_t$, a neck width $W_n$, and a bottom width $W_b$, as shown in FIG. 1E in accordance with some embodiments. Top width $W_t$ may be defined as the width of the top surface of dummy gate structure 114. Bottom width $W_b$ may be defined as the width of the bottom surface of dummy gate structure 114. Neck width $W_n$ may be defined as the largest width of dummy gate structure 114 measured from a position located between the top surface and the bottom surface of dummy gate structure 114.

In some embodiments, neck width $W_n$ is larger than both top width $W_t$ and bottom width $W_b$. Dummy gate structure 114 having relatively large neck width $W_n$ enables the improvement of the electrical performance of the metal gate structure formed in the subsequent processes, and the details will be described later.

In some embodiments, a ratio of neck width $W_n$ to the top width $W_t$ is in a range from about 1.01 to about 1.51. When the ratio of neck width $W_n$ to the top width $W_t$ is too large, the relatively stronger adhesion between the metal gate and the sidewalls will result in positive device shift due to lowered resistance. When the ratio of neck width $W_n$ to the top width $W_t$ is too small, the relatively weaker adhesion between the metal gate and the sidewall will result in negative device shift due to higher resistance. In some embodiments, a ratio of neck width $W_n$ to the bottom width $W_b$ is in a range from about 1.01 to about 1.44. Similarly, when the ratio of neck width $W_n$ to the bottom width $W_b$ is too large, the resulting device will not perform as designed. When the ratio of neck width $W_n$ to the bottom width $W_b$ is too small, device becomes slower due to looser metal gate adhesion.

It should be noted that, although dummy gate structure 114 shown in FIG. 1E is divided into upper portion 118 and bottom portion 122 there is no actual interface between upper portion 118 and bottom portion 122. That is, the dotted line shown in FIG. 1E is merely for better understanding the concept of the disclosure, and the scope of the disclosure is not intended to be limiting.

Furthermore, a first distance $D_1$ is measured from the top surface to the bottom surface of dummy gate structure 114, and first distance $D_1$ may also be seen as the height of dummy gate structure 114. A second distance $D_2$ is measured from the bottom surface of dummy gate structure 114 to the position from which neck width $W_n$ is measured. In some embodiments, a ratio of second distance $D_2$ to first distance $D_1$ is in a range from about 0.26 to about 0.39.

Figure 1F:
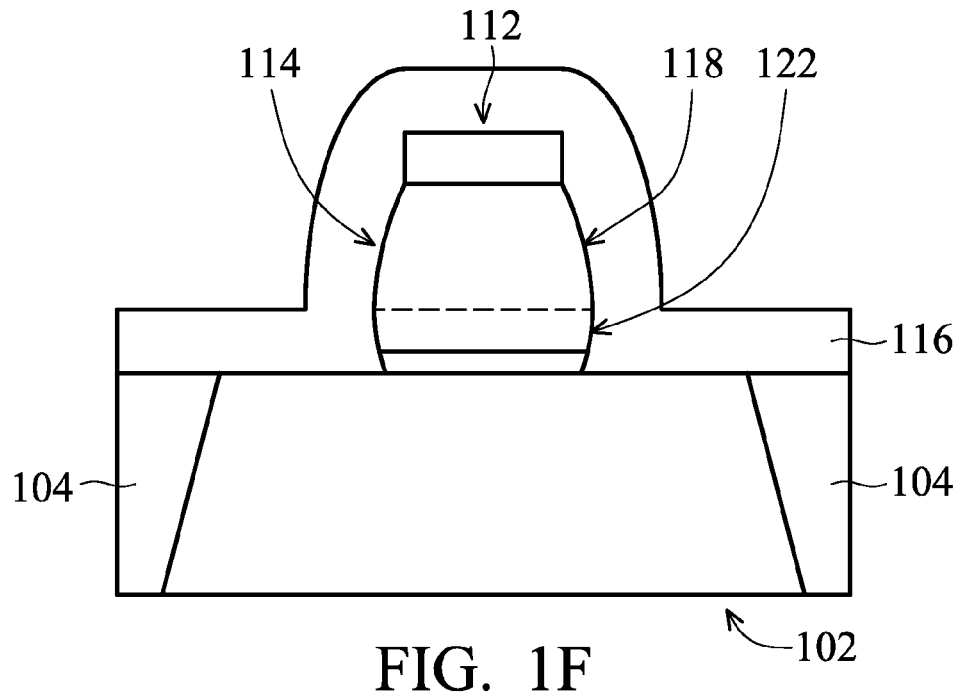

After dummy gate structure 114 is formed on substrate 102, a dielectric layer 116 is formed to cover dummy gate structure 114 over substrate 102, as shown in FIG. 1F in accordance with some embodiments. Dielectric layer 116 may be made of silicon nitride, silicon oxide, silicon carbide, silicon oxynitride, or other applicable materials. Dielectric layer 116 may be formed by chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 1G:
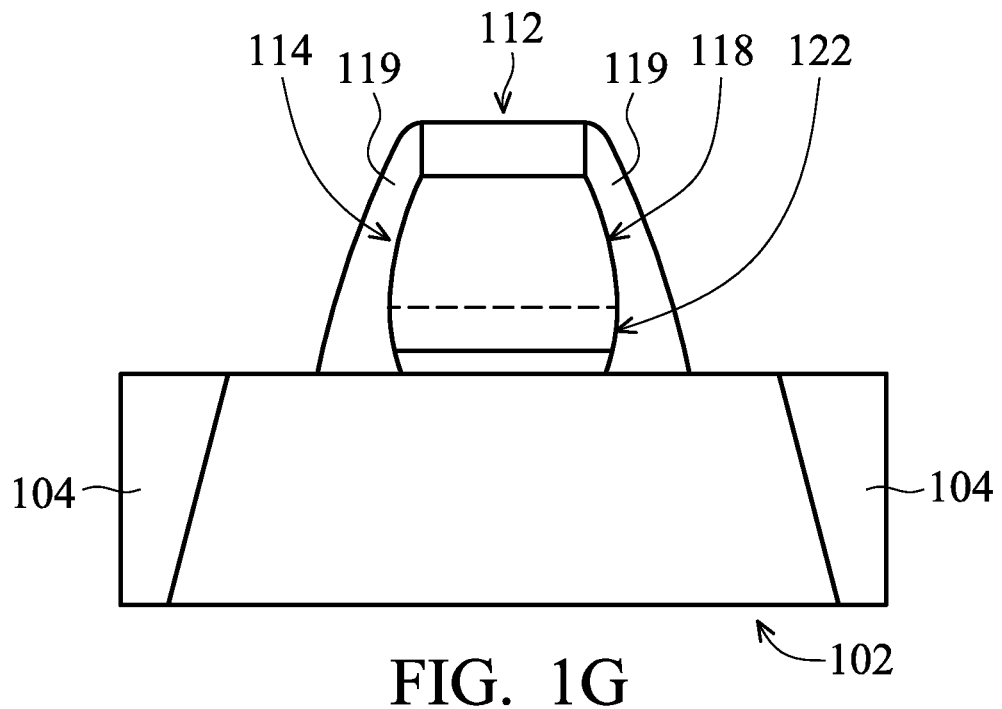

Next, a dry etching process is performed to form spacers 119, as shown in FIG. 1G in accordance with some embodiments. In some embodiments, the dry etching process includes using an etching gas, and the etching gas comprises helium (He), argon (Ar), hydrogen bromide (HBr), nitrogen ($N_2$), methane ($CH_4$), tetrafluoromethane ($CF_4$), monofluoromethane ($CH_3F$), difluoromethane ($CH_2F_2$), trifluoromethane ($CHF_3$), oxygen ($O_7$), or a combination thereof.

Figure 1H:
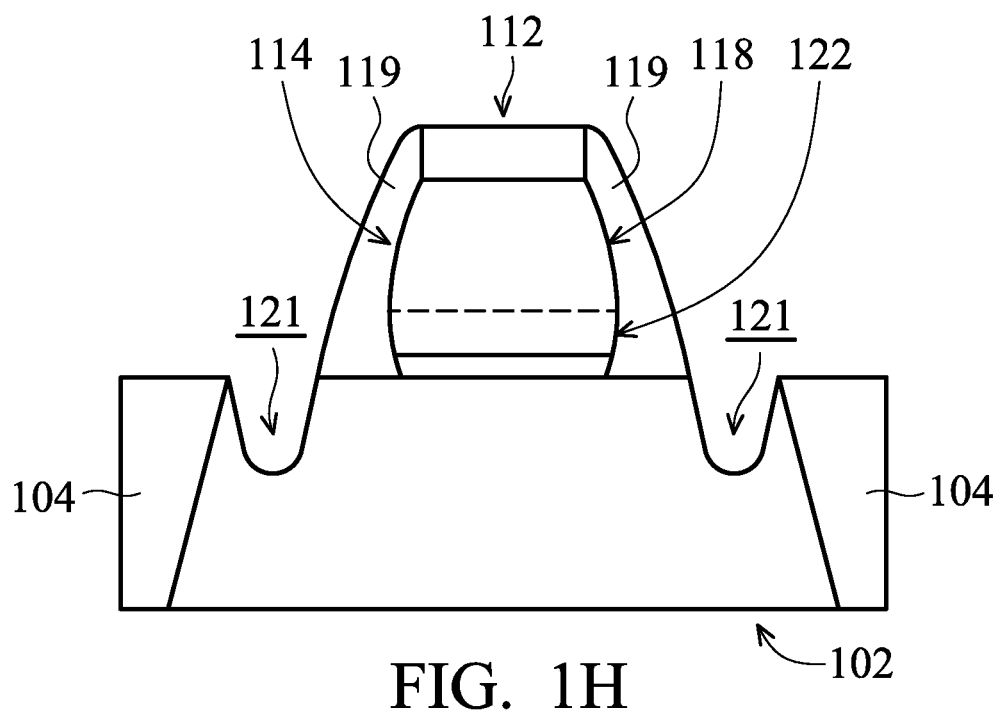

After spacers 119 are formed, source and drain regions are formed in substrate 102 in accordance with some embodiment. More specifically, substrate 102 is recessed to form recesses 121, as shown in FIG. 1H in accordance with some embodiments. In some embodiments, recesses 121 are aligned with spacers 119. Recesses 121 may be formed by a dry etching process.

Figure 1I:
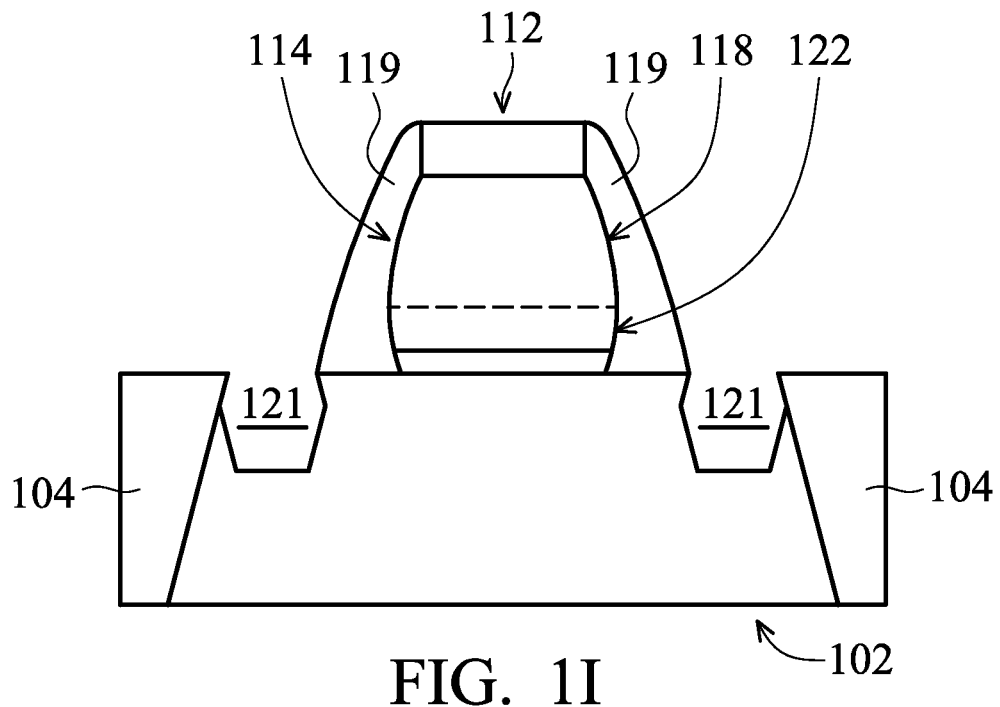

Afterwards, recesses 121 are further etched to form enlarged recesses 122, as shown in FIG. 1I in accordance with some embodiments. In some embodiments, enlarged recesses 122 are aligned with spacers 119. Enlarged recesses 122 may be formed by a wet etching process.

Figure 1J:
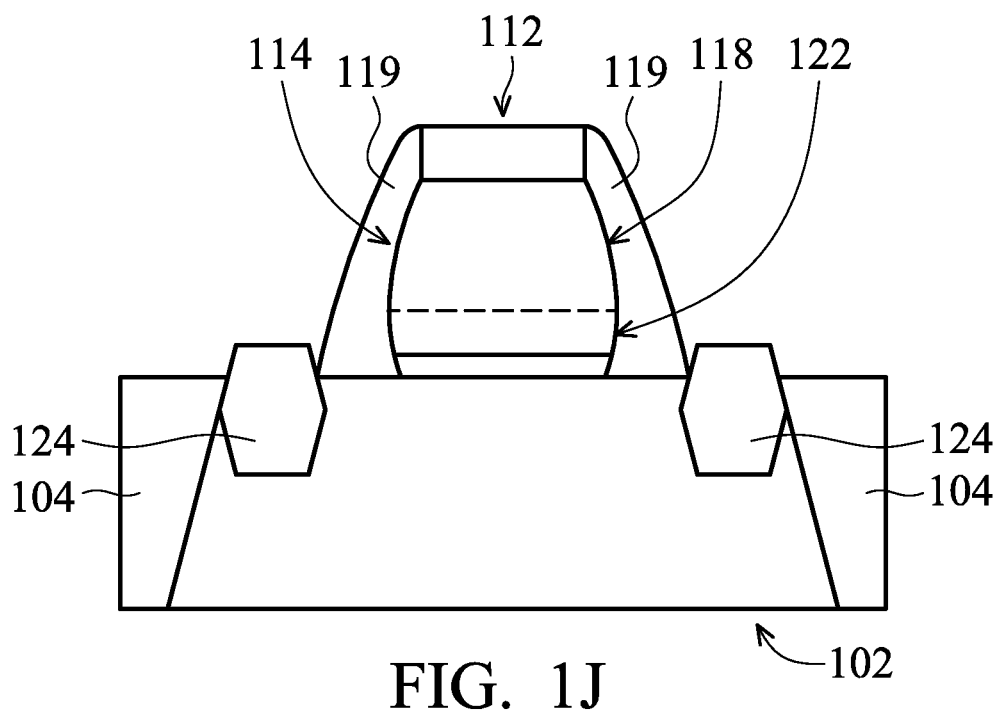

Next, a semiconductor material is filled in enlarged recesses 122 to form strained source and drain (SSD) structures 124, as shown in FIG. 1J in accordance with some embodiments. In some embodiments, silicon germanium (SiGe) is formed in enlarged recesses 122 of substrate 102 to form SiGe source and drain structures. Strained source and drain structures 124 may alternatively be referred to as raised source and drain regions.

In some embodiments, strained source and drain structure 124 are formed by an epitaxial (epi) process. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, or other applicable epi processes. The epi process may use gaseous and/or liquid precursors, which may interact with the composition of substrate 102. The deposited semiconductor material may be different from substrate 102. Accordingly, a channel region is strained or stressed to improve carrier mobility of the device and enhance device performance.

In addition, strained source and drain structures 124 may be in-situ doped or undoped during the epi process. If strained source and drain structures 124 are undoped during the epi process, they may be doped in subsequent processes. For example, strained source and drain structure 124 may be doped by an ion implantation process, plasma immersion ion implantation (PHI) process, gas and/or solid source diffusion process, or other applicable processes. In addition, an annealing process may further be processed to strained source and drain structure 124, such as a rapid thermal annealing process. However, it should be noted that, although strained source and drain structures 124 are shown in FIGS. 1H to 1M, they are merely examples, and the source and drain regions of the disclosure are not limited to strained source and drain structures.

Figure 1K:
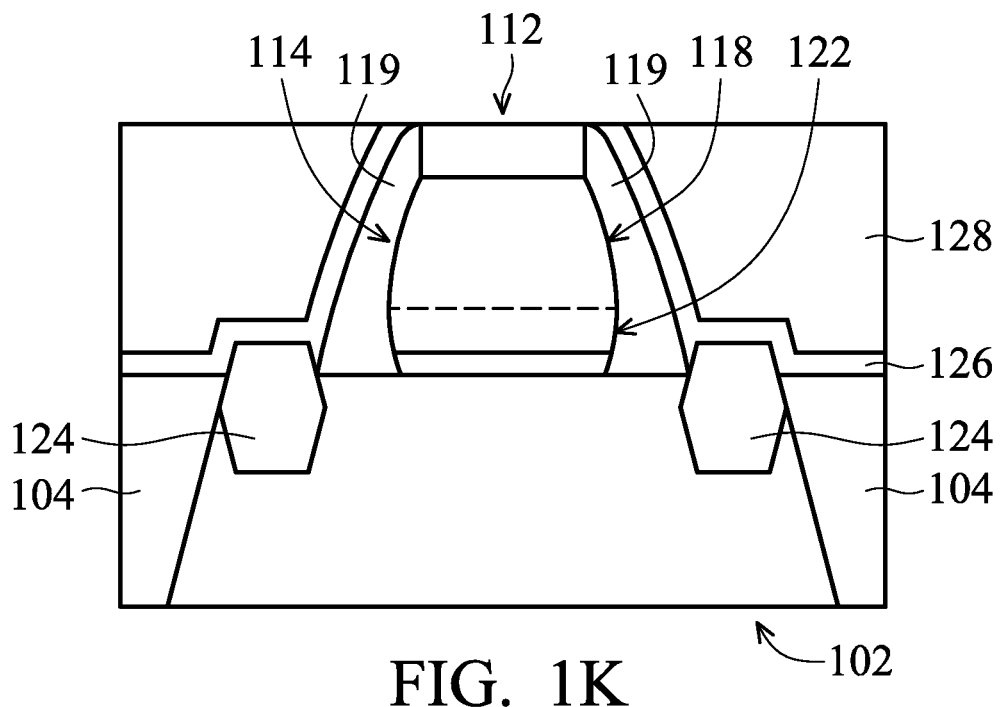

After strained source and drain structures 124 are formed, a contact etch stop layer (CESL) 126 is formed to cover dummy gate structure 114 over substrate 102, as shown in FIG. 1K in accordance with some embodiments. In some embodiments, contact etch stop layer 126 is made of silicon nitride, silicon oxynitride, and/or other applicable materials. Contact etch stop layer 126 may be formed by plasma enhanced CVD, low pressure CVD, ALD, or other applicable processes.

After contact etch stop layer 126 is formed, an inter-layer dielectric (ILD) layer 128 is formed on contact etch stop layer 126 over substrate 102 in accordance with some embodiments. Inter-layer dielectric layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 128 may be formed by chemical vapor deposition (CVD), physical vapor deposition, (PVD), atomic layer deposition (ALD), spin-on coating, or other applicable processes.

Afterwards, a polishing process is performed to inter-layer dielectric layer 128, as shown in FIG. 1K in accordance with some embodiments. In some embodiments, inter-layer dielectric layer 128 is planarized by a chemical mechanical polishing (CMP) process until the top surfaces of dummy gate structure 114 is exposed.

Figure 1L:
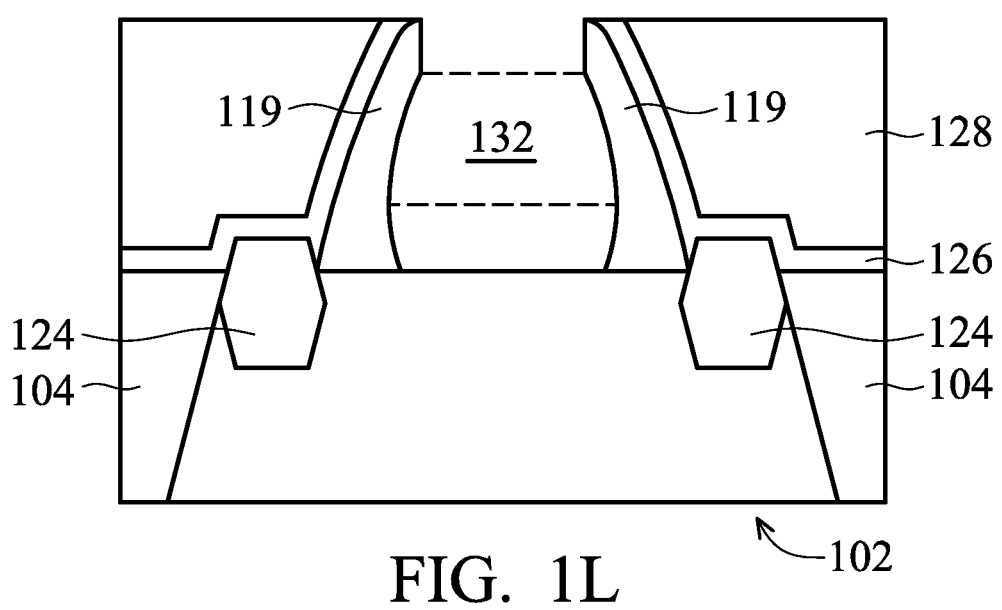

After the polishing process is performed, dummy gate structure 114 is replaced by a metal gate structure 130. More specifically, dummy gate structure 114 is removed to form trench 132, as shown in FIG. 1L in accordance with some embodiments. As described previously, dummy gate structure 114 has a relatively large neck width $W_n$, compared to top width $W_t$ and bottom width $W_b$. Therefore, trench 132 formed by removing dummy gate structure 114 also has a relatively large neck width, which is larger than the top width and the bottom width of trench 132.

Figure 1M:
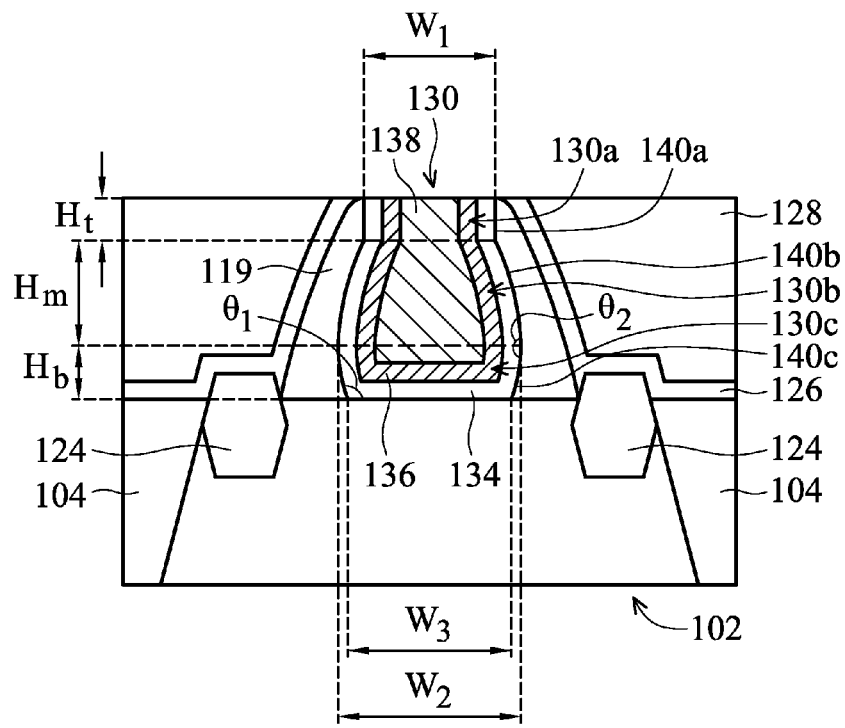

Hard mask structure 112, dummy gate electrode layer 108, and dummy gate dielectric layer 106 may be removed by various etching processes. After hard mask structure 112, dummy gate electrode layer 108, and dummy gate dielectric layer 106 are removed, metal gate structure 130 is formed in trench 132, as shown in FIG. 1M in accordance with some embodiments.

In some embodiments, metal gate structure 130 includes a high-k dielectric layer 134, a work function metal layer 136, and a metal gate electrode layer 138. In some embodiments, high-k dielectric layer 134 is made of high k dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 136 is formed over high-k dielectric layer 134 in accordance with some embodiments. Work function metal layer 136 is tuned to have a proper work function. For example, if a P-type work function metal (P-metal) for a PMOS device is desired, P-type work function materials may be used. Examples of the P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of the N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

It should be noted that work function metal layer 136 may be a single layer or may include multiple layers made of various work function materials, although only one layer is shown in FIG. 1M, and the scope of the disclosure is not intended to be limiting.

Metal gate electrode layer 138 is formed over work function metal layer 136 in accordance with some embodiments. In some embodiments, metal gate electrode layer 138 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. Gate dielectric layer 134, work function metal layer 136, and metal gate electrode layer 138 may be formed by any applicable process to any applicable thickness.

It should be noted that additional layers may be formed above and/or below gate dielectric layer 134, work function metal layer 136, and metal gate electrode layer 138, such as liner layers, interface layers, seed layers, adhesion layers, barrier layers, or the like. In addition, gate dielectric layer 134, work function metal layer 136, and metal gate electrode layer 138 may include one or more materials and/or one or more layers.

As described above, dummy gate structure 114 has a relatively large neck width $W_n$, and therefore, trench 132 also has a relatively large neck width. The relatively large neck width of trench 132 enable the improvement of the adhesion between metal gate structure 130 and spacers 119. In addition, metal gate structure 130 also has a relatively large neck width in accordance with some embodiments.

As shown in FIG. 1M, metal gate structure 130 has a top surface, a bottom surface, and a curved sidewall. In some embodiments, an angle $\theta_1$ between the bottom surface and the curved sidewall is larger than 90°. In some embodiments, angle $\theta_1$ between the bottom surface and the curved sidewall is in a range from about 91° to about 91.8°. When angle $\theta_1$ between the bottom surface and the curved sidewall is too large, hot carrier effect may happen. When angle $\theta_1$ between the bottom surface and the curved sidewall is too small, metal void may be formed.

In addition, metal gate structure 130 has a top portion 130a, a middle portion 130b, and a bottom portion 130c, as shown in FIG. 1M in accordance with some embodiments. Top portion 130a of metal gate structure 130 may have a height $H_t$. Middle portion 130b of metal gate structure 130 may have a height $H_m$. Bottom portion 130c of metal gate structure 130 may have a height $H_b$.

In some embodiments, height $H_t$ is substantially equal to the thickness of hard mask structure 112. In some embodiments, height $H_m$ is substantially equal to the thickness of upper portion 118 of dummy gate structure 114. In some embodiments, height $H_b$ is substantially equal to the thickness of bottom portion 122 of dummy gate structure 114. In some embodiments, a ratio of height $H_m$ of middle portion 130b to height $H_b$ of bottom portion 130c of metal gate structure 130 is in a range from about 1.5 to about 3. When the ratio of height $H_m$ to height $H_b$ is too large, metal void may be formed. When the ratio of height $H_m$ to height $H_b$ is too small, hot carrier effect may happen.

Furthermore, since metal gate structure 130 has top portion 130a, middle portion 130b, and bottom portion 130c, each curved sidewall of metal gate structure 130 also has a top portion 140a, a middle portion 140b, and a bottom portion 140c. In some embodiments, an angle $\theta_2$ between middle portion 140b and bottom portion 140c of the curved sidewall of metal gate structure 130 is smaller than 180°. In some embodiments, angle $\theta_2$ between middle portion 140b and bottom portion 140c of the curved sidewall of metal gate structure 130 is in a range from about 120° to about 170°.

As shown in FIG. 1M, top portion 140a of the curved sidewall, which may be seen as the curved sidewall of metal gate structure 130 at top portion 130a, has a first inclination. In addition, middle portion 140b of the curved sidewall, which may be seen as the curved sidewall of metal gate structure 130 at middle portion 130b, has a second inclination, and bottom portion 140c of the curved sidewall, which may be seen as the curved sidewall of metal gate structure 130 at bottom portion 130c, has a third inclination. In some embodiments, the first inclination, the second inclination, and the third inclination of the curved sidewall are different from one another.

Furthermore, metal gate structure 130 has a first width $W_1$, a second width $W_2$, and a third width $W_3$. More specifically, an interface between top portion 130 and middle portion 130b of metal gate structure 130 has first width $W_1$. That is, first width $W_1$ is a width measured from an intersection of top portion 140a and middle portion 140b of the curved sidewall of metal gate structure 130.

In addition, an interface between middle portion 130b and bottom portion 130c of metal gate structure 130 has second width $W_2$. That is, second width $W_2$ is a width measured from an intersection of middle portion 140b and bottom portion 140c of the curved sidewall of metal gate structure 130. In addition, third width $W_3$ is a width measured from a bottom surface of metal gate structure 130.

In some embodiments, second width $W_2$ is larger than both first width $W_1$ and third width $W_3$. In some embodiments, a ratio of second width $W_2$ to first width $W_1$ is in a range from about 1.01 to about 1.51. When ratio of second width $W_2$ to first width $W_1$ is too large, a positive device shift may happen and the device will not performed as designed. When ratio of second width $W_2$ to first width $W_1$ is too small, a negative device shift may happen and the device will become slower. In some embodiments, a ratio of second width $W_2$ to third width $W_3$ is in a range from about 1.01 to about 1.44. When ratio of second width $W_2$ to third width $W_3$ is too large, a hot carrier effect may happen. When ratio of second width $W_2$ to third width $W_3$ is too small, metal void may be formed.

It should be noted that, although metal gate structure 130 shown in FIG. 1M is divided into top portion 130a, middle portion 130b, and bottom portion 130c, there is no actual interface between them. That is, the dotted lines shown in FIG. 1M are merely for better understanding the concept of the disclosure, and the scope of the disclosure is not intended to be limiting.

As described previously, dummy gate structure 114 has a relatively large neck width $W_n$, and therefore trench 132 also has a relatively large neck width. The relatively large neck width of trench 132 enables metal gate structure 130 formed therein to have better adhesion with spacers 119. Therefore, the electrical performance of metal gate structure 130 may be improved.

In addition, when metal gate structure 130 is formed in trench 132 having the relatively large neck width, the resulting metal gate structure 130 may also have better uniformity. Therefore, the yield in forming the semiconductor structure including metal gate structure 130 is also improved.

Furthermore, the profile of dummy gate structure 114 is controlled by adjusting the amount of the first etching gas and the second etching gas used in first etching process 116 and second etching process 120 in accordance with some embodiments. That is, dummy gate structure 114 with a designed profile can be formed by in-situ adjusting the condition of the etching processes without using complicated and/or additional processes.

Embodiments for forming a semiconductor structure are provided. The semiconductor structure includes a metal gate structure. The metal gate structure is formed by forming a dummy gate structure and replacing the dummy gate structure by the metal gate structure afterwards. The profile of the dummy gate structure is designed, such that the electrical performance of the metal gate structure can be improved. In addition, no complicated processes are required.

In some embodiments, a semiconductor structure is provided. The semiconductor structure includes a metal gate structure having curved sidewalls formed over a substrate. The semiconductor structure further includes spacers formed on the curved sidewalls of the metal gate structure. In addition, each curved sidewall of the metal gate structure has a top portion, a middle portion, and a bottom portion, and an angle between the middle portion and the bottom portion of the curved sidewall of the metal gate structure is smaller than 180°.

In some embodiments, a semiconductor structure is provided. The semiconductor structure includes a metal gate structure formed over a substrate. The semiconductor structure further includes spacers formed on sidewalls of the metal gate structure. In addition, the metal gate structure has a bottom surface and a curved sidewall, and an angle between the bottom surface and the curved sidewall is larger than 90°.

In some embodiments, a method for forming a semiconductor structure is provided. The method for forming a semiconductor structure includes forming a polysilicon layer over a substrate and forming a hard mask structure over the polysilicon layer. The method for forming a semiconductor structure further includes etching the polysilicon layer to form a dummy gate structure below the hard mask structure. The method for forming a semiconductor structure further includes forming spacers over sidewalls of the dummy gate structure. The method for forming a semiconductor structure further includes replacing the dummy gate structure by a metal gate structure. In addition, the dummy gate structure has a top width, a neck width, and a bottom width, and the neck width is larger than both the top width and the bottom width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a polysilicon layer over a substrate;
    forming a hard mask structure over the polysilicon layer;
    etching the polysilicon layer to form a dummy gate structure below the hard mask structure;
    forming spacers over sidewalls of the dummy gate structure; and
    replacing the dummy gate structure by a metal gate structure,
    wherein the dummy gate structure has a top width, a neck width, and a bottom width, and the neck width is larger than both the top width and the bottom width.

2. The method for forming a semiconductor structure as claimed in claim 1, wherein the step of etching the polysilicon layer to form the dummy gate structure further comprises:
    etching the polysilicon layer to form an upper portion of the dummy gate structure by a first etching process; and
    etching the polysilicon layer to form a bottom portion of the dummy gate structure by a second etching process,
    wherein a first etching gas and a second gas are used in both the first etching process and the second etching process, and a volume ratio of the first etching gas to the second etching gas used in the first etching process is smaller than a volume ratio of the first etching gas to the second etching gas used in the second etching process.

3. The method for forming a semiconductor structure as claimed in claim 2, wherein the first etching gas is $CF_4$, and the second etching gas is $Cl_2$.

4. The method for forming a semiconductor structure as claimed in claim 1, wherein a ratio of the neck width to the top width is in a range from about 1.01 to about 1.51.

5. The method for forming a semiconductor structure as claimed in claim 1, wherein a ratio of the neck width to the bottom width is in a range from about 1.01 to about 1.44.

6. The method for forming a semiconductor structure as claimed in claim 1, wherein the top width is a width of a top surface of the dummy gate structure, the bottom width is a width of a bottom surface of the dummy gate structure, and the neck width is the largest width of the dummy gate structure measured from a position located between the top surface and the bottom surface of the dummy gate structure.

7. The method for forming a semiconductor structure as claimed in claim 6, wherein a first distance is measured from the top surface to the bottom surface of the dummy gate structure, a second distance is measured from the bottom surface of the dummy gate structure to the position from which the neck width is measured, and a ratio of the second distance to the first distance is in a range from about 0.26 to about 0.39.

8. The method for forming a semiconductor structure as claimed in claim 1, wherein the metal gate structure has a top surface, a bottom surface, and a curved sidewall, and an angle between the top surface and the curved sidewall and an angle between the bottom surface and the curved sidewall are both larger than 90°.

9. A method for forming a semiconductor structure, comprising:
    forming a dummy gate layer over a substrate;

patterning a top portion of the dummy gate layer to form an upper portion of a dummy gate structure by performing a first etching process; and patterning a bottom portion of the dummy gate layer to form a bottom portion of the dummy gate structure by performing a second etching process, wherein the first etching process is different from the second etching process, such that a first inclination of a sidewall of the upper portion is different from a second inclination of a sidewall of the bottom portion.

10. The method for forming a semiconductor structure as claimed in claim 9, wherein both the first etching process and the second etching process comprise using a first etching gas and a second etching gas, but a volume ratio of the first etching gas to the second etching gas used in the first etching process is different from a volume ratio of the first etching gas to the second etching gas used in the second etching process.

11. The method for forming a semiconductor structure as claimed in claim 10, wherein the first etching gas comprises $CF_4$, $CH_2F_2$, or $CHF_3$, and the second etching gas comprises $Cl_2$, HBr, or $SF_6$.

12. The method for forming a semiconductor structure as claimed in claim 11, further comprising:

replacing the dummy gate structure by a metal gate structure, wherein the metal gate structure has curved sidewalls.

13. The method for forming a semiconductor structure as claimed in claim 10, wherein the volume ratio of the first etching gas to the second etching gas used in the first etching process is smaller than the volume ratio of the first etching gas to the second etching gas used in the second etching process, such that the first inclination of the sidewall of the upper portion is smaller than the second inclination of the sidewall of the bottom portion.

14. The method for forming a semiconductor structure as claimed in claim 13, wherein the upper portion of the dummy gate structure has a first height, and the bottom portion of the dummy gate structure has a second height, and a ratio of the first height to the second height is in a range from about 1.5 to about 3.

15. The method for forming a semiconductor structure as claimed in claim 9, wherein an angle between the first inclination and the second inclination measured from an inner side of the dummy gate structure is smaller than 180°.

16. A method for forming a semiconductor structure, comprising:

forming a dummy gate layer over a substrate;

patterning the dummy gate layer to form a dummy gate structure having an upper portion and a bottom portion such that a first inclination of a sidewall of the upper portion of the dummy gate structure is smaller than a second inclination of a sidewall of the bottom portion of the dummy gate structure; and replacing the dummy gate structure by a metal gate structure, wherein an angle between the first inclination and the second inclination measured from an inner side of the dummy gate structure is smaller than 180°.

17. The method for forming a semiconductor structure as claimed in claim 16, wherein the upper portion of the dummy gate structure is formed by performing a first etching process and the bottom portion of the dummy gate structure is formed by performing a second etching process, the first etching process is different from the second etching process.

18. The method for forming a semiconductor structure as claimed in claim 17, wherein both the first etching process and the second etching process comprise using a first etching gas and a second etching gas, but a volume ratio of the first etching gas to the second etching gas used in the first etching process is smaller than a volume ratio of the first etching gas to the second etching gas used in the second etching process.

19. The method for forming a semiconductor structure as claimed in claim 16, wherein the dummy gate structure has a top width at its top surface, a bottom width at its bottom surface, and a neck width at a middle of the dummy gate structure, and the neck width is larger than the top width and the bottom width.

20. The method for forming a semiconductor structure as claimed in claim 16, wherein the dummy gate layer is a polysilicon layer.

* * * * *